(12) United States Patent
Goshonoo et al.

(10) Patent No.: US 12,107,185 B2
(45) Date of Patent: Oct. 1, 2024

(54) LIGHT-EMITTING ELEMENT AND METHOD FOR MANUFACTURING SAME

(71) Applicant: TOYODA GOSEI CO., LTD., Kiyosu (JP)

(72) Inventors: Koichi Goshonoo, Kiyosu (JP); Atsushi Miyazaki, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 681 days.

(21) Appl. No.: 17/417,569

(22) PCT Filed: Jan. 21, 2020

(86) PCT No.: PCT/JP2020/001874
§ 371 (c)(1),
(2) Date: Jun. 23, 2021

(87) PCT Pub. No.: WO2020/153339
PCT Pub. Date: Jul. 30, 2020

(65) Prior Publication Data
US 2022/0059722 A1 Feb. 24, 2022

(30) Foreign Application Priority Data
Jan. 23, 2019 (JP) ................................. 2019-009063

(51) Int. Cl.
*H01L 33/08* (2010.01)
*H01L 33/00* (2010.01)
*H01L 33/06* (2010.01)

(52) U.S. Cl.
CPC ............ *H01L 33/08* (2013.01); *H01L 33/007* (2013.01); *H01L 33/06* (2013.01)

(58) Field of Classification Search
CPC ........ H01L 33/08; H01L 33/007; H01L 33/06
See application file for complete search history.

(56) References Cited

U.S. PATENT DOCUMENTS

| 5,436,193 A | 7/1995 | Beernink et al. |
| 2021/0305457 A1* | 9/2021 | Goshonoo ............... H01L 33/42 |

FOREIGN PATENT DOCUMENTS

| JP | H07-176833 A | 7/1995 |
| JP | H08-88408 A | 4/1996 |

(Continued)

OTHER PUBLICATIONS

Japanese Office Action, dated Dec. 7, 2021, in Japanese Application No. 2019-009063 and English Translation thereof.

(Continued)

*Primary Examiner* — Errol V Fernandes
(74) *Attorney, Agent, or Firm* — MCGINN I.P. LAW GROUP, PLLC

(57) ABSTRACT

A light emitting element includes a substrate and a first light emitting part and a second light emitting part arranged thereon to emit different colored lights. The first light emitting part includes a first laminate structure where a n-type semiconductor film and a first semiconductor film are laminated, a first capping film and a p-type semiconductor film laminated on the first laminate structure. The second light emitting part includes a second laminate structure where the n-type semiconductor film, the first semiconductor film, a first intermediate film, and a second semiconductor film are laminated, a second capping film and the p-type semiconductor film laminated on the second laminate structure, the first capping film being the first intermediate film. A bandgap of the first intermediate film is higher than the first semiconductor film and the second semiconductor film. The bandgap of the second semiconductor film is lower than the first semiconductor film.

9 Claims, 9 Drawing Sheets

(56) References Cited

FOREIGN PATENT DOCUMENTS

JP       H11-74566 A     3/1999
JP     2012-195529 A   10/2012

OTHER PUBLICATIONS

International Search Report (ISR) (PCT Form PCT/ISA/210), in PCT/JP2020/001874, dated Apr. 7, 2020.

\* cited by examiner

LIGHT-EMITTING ELEMENT AND METHOD FOR MANUFACTURING SAME

TECHNICAL FIELD

The present invention relates to a light emitting element and a method for manufacturing the light emitting element.

BACKGROUND ART

A light emitting element is known which is provided with a plurality of light emitting parts emitting different colored lights on the same substrate (see e.g., Patent Literatures 1, 2).

In the patent literature 1, a technique is disclosed by which a red light emitting part, a green light emitting part, and a blue light emitting part are formed by etching a laminate structure laminating a semiconductor layer that may serves as a light emitting layer for the red light emitting part, a semiconductor film that may serves as a light emitting layer for the green light emitting part, and a semiconductor layer that may serves as a light emitting layer for the blue light emitting part on the substrate.

In the patent literature 2, the light emitting element is disclosed which is formed by repeatedly laminating a three-layer light emitting part as one unit on the same substrate, the three-layer light emitting part joining a n-layer indicating n-type conduction, a p-layer indicating p-type conduction, and a light emitting layer sandwiched between the n-layer and the p-layer by the double heterojunction that is the structure sandwiching the semiconductor having wide band-gap between the semiconductors having narrow bandgap.

CITATION LIST

Patent Literature

Patent Literature 1: JP H11/074566 A
Patent Literature 2: JP H08/088408 A

SUMMARY OF INVENTION

Technical Problem

According to the technique disclosed in Patent Literature 1, since it is hard to stop etching at an interface between semiconductor layers proximate in the upper and lower directions, thickness of the uppermost semiconductor layer in the green light emitting part and the blue light emitting part, which are etched may be varied and thus light emitting characteristic may be varied.

In addition, according to the technique disclosed in Patent Literature 2, since it is necessary to form the n-layer and the p-layer sandwiching the light emitting layer for each of the light emitting parts for each color, dopant may be separated from many n-layers and p-layers and thus the light emitting characteristic may be negatively affected.

It is an object of the invention to solve the above problems and therefor provide a light emitting element which has plural light emitting parts emitting different colored lights on the same substrate, and which controls degradation caused by varying light emitting characteristic or spreading dopant, and the method for manufacturing the light emitting element.

Solution to Problem

An embodiment of the invention provides the light emitting element according to the following [1] to [9] and the method for manufacturing the light emitting element according to [10] to [13] to achieve the above object.

[1] A light emitting element, comprising:
a substrate; and
a first light emitting part and a second light emitting part that are arranged on the substrate and emits different colored lights,
wherein the first light emitting part comprises a first laminate structure in which a n-type semiconductor film and a first semiconductor film are laminated, a first capping film and a p-type semiconductor film laminated on the first laminate structure,
wherein the second light emitting part comprises a second laminate structure in which the n-type semiconductor film, the first semiconductor film, a first intermediate film, and a second semiconductor film are laminated, a second capping film and the p-type semiconductor film laminated on the second laminate structure,
wherein the first capping film is the first intermediate film,
wherein a bandgap of the first intermediate film is higher than bandgaps of the first semiconductor film and the second semiconductor film,
wherein the bandgap of the second semiconductor film is lower than the bandgap of the first semiconductor film,
wherein the first semiconductor film serves as a light emitting layer by applying voltage to define a p-type semiconductor film side of the first light emitting part as anode and a n-type semiconductor layer side of the first light emitting part as cathode, and
wherein the second semiconductor film serves as a light emitting layer by applying voltage to define a p-type semiconductor film side of the second light emitting part as anode and a n-type semiconductor layer side of the second light emitting part as cathode.

[2] The light emitting element according to [1], wherein a thickness of the first intermediate film is not less than one-third of a thickness of the second semiconductor film.

[3] The light emitting element according to [1], comprising a third light emitting part that is arranged on the substrate and emits colored light different from the first light emitting part and the second light emitting part,
wherein the third light emitting part comprises a third laminate structure in which the n-type semiconductor film, the first semiconductor film, the first intermediate film, the second semiconductor film, a second intermediate film, and a third semiconductor film are laminated, a third capping film and the p-type semiconductor film laminated on the third laminate structure,
wherein the second capping film is the second intermediate film,
wherein the bandgap of the first intermediate film is higher than bandgaps of the first semiconductor film, the second semiconductor film, and the third semiconductor film,
wherein the bandgap of the second intermediate film is higher than the bandgaps of the second semiconductor film and the third semiconductor film,
wherein the bandgap of the third semiconductor film is lower than the bandgap of the second semiconductor film, and
wherein the third semiconductor film serves as a light emitting layer by applying voltage to define a p-type semiconductor film side of the third light emitting part as anode and a n-type semiconductor layer side of the third light emitting part as cathode.

[4] The light emitting element according to [3], wherein light emitting colors of the first light emitting part, the second light emitting part, and the third light emitting part are respectively blue, green, and red.

[5] The light emitting element according to [3] or [4], wherein a thickness of the first intermediate film is not less than one-third of a thickness of the second semiconductor film, and
wherein the thickness of the second intermediate film is not less than one-third of a thickness of the third semiconductor film.

[6] The light emitting element according to any one of [3] to [5], wherein the bandgap of the second intermediate film is lower than the bandgap of the first intermediate film.

[7] The light emitting element according to any one of [3] to [6], wherein the first semiconductor film, the second semiconductor film, and the third semiconductor film have a multi quantum well structure,
wherein a barrier of the first semiconductor film is thinner than a barrier of the second semiconductor film,
wherein the barrier of the second semiconductor film is thinner than a barrier of the third semiconductor film.

[8] The light emitting element according to any one of [3] to [7], wherein the first light emitting part, the second light emitting part, and the third light emitting part are arranged such that the first light emitting part is not adjacent to the third light emitting part.

[9] A light emitting element emitting device emitting different colored lights from a plurality of light emitting parts arranged in lines on a sharing substrate,
wherein the plurality of light emitting parts respectively comprises a plurality of light emitting layers emitting the different colored lights in a position according to a predetermined laminating order,
wherein the plurality of light emitting layers has a structure that chooses one light emitting layer corresponding to an emitted light having color respectively assigned by the plurality of light emitting parts and applies driving voltage.

[10] A method for manufacturing a light emitting element, the method comprising:
laminating a n-type semiconductor film, a first semiconductor film, a first intermediate film, a second semiconductor film, and a capping film on a substrate;
etching a partial region of the first intermediate film in a first region on the substrate while protecting a second region on the substrate and removes the capping film, the second semiconductor film, and an upper partial region of the first intermediate film; and
forming a p-type semiconductor film on the first intermediate film in the first region and the capping film in the second region.

[11] The method according to [10], comprising separating the p-type semiconductor film, the first intermediate film, and the first semiconductor film, which continue between the first region and the second region.

[12] The method according to [10], comprising laminating a second intermediate film and a third semiconductor film between the second semiconductor film and the capping film, the etching comprising a first etching to etch a partial region of the second intermediate film in the first region and the second region while protecting a third region on the substrate and removes the capping film, the third semiconductor film, and an upper partial region of the second intermediate film, and a second etching to etch a partial region of the first intermediate film in the first region while protecting the second region and the third region and removes the second intermediate film, the second semiconductor film, and an upper partial region of the first intermediate film, and
forming the p-type semiconductor film on the first intermediate film in the first region, the second intermediate film in the second region, and the capping film in the third region.

[13] The method according to [12], comprising separating the p-type semiconductor film, the second intermediate film, the second semiconductor film, the first intermediate film, and the first semiconductor film, which continue between the first region, second region, and the third region.

Advantageous Effects of Drawings

According to the invention, it is possible to provide a light emitting element comprising a plurality of light emitting parts emitting different colored lights on the same substrate, which controls degradation caused by varying light emitting characteristic or spreading dopant, and the method for manufacturing the same.

DESCRIPTION OF EMBODIMENTS

Embodiment

Figure 1:
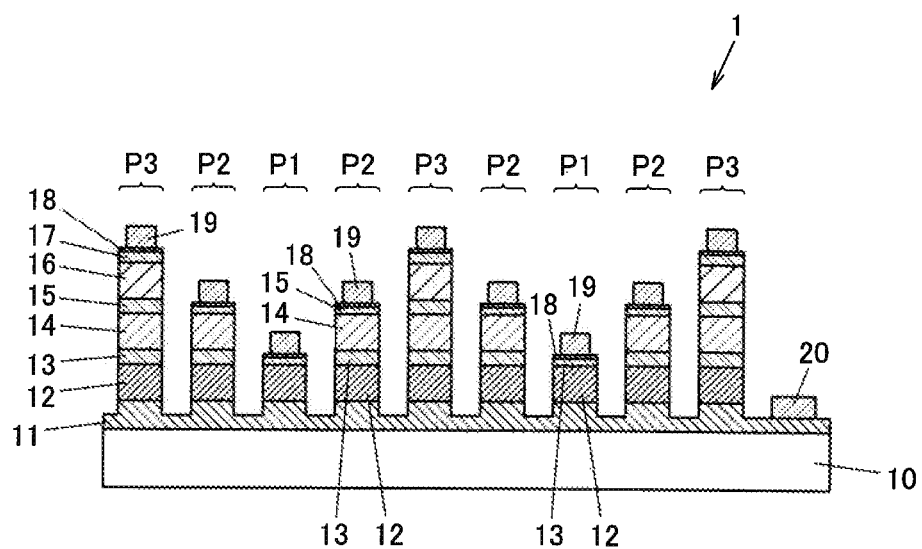
FIG. 1 is a vertical cross-sectional view showing a light emitting element according to the embodiment of the invention.

FIG. 1 is a vertical cross-sectional view showing a light emitting element 1 according to the embodiment of the invention. The light emitting element 1 comprises a substrate 10 such as a sapphire substrate, and a first light emitting part P1, a second light emitting part P2, and a third light emitting part, which respectively emit different colored lights.

The first light emitting part P1 comprises a first laminate structure laminating a n-type semiconductor film 11 and a first semiconductor film 12, and a first intermediate film 13 laminated on the first laminate structure, and a p-type semiconductor film 18. The first intermediate film 13 serves as a capping film of the first laminate structure.

The second light emitting part P2 comprises a second laminate structure laminating the n-type semiconductor film 11, the first semiconductor film 12, the first intermediate film 13, and a second semiconductor film 14, a second intermediate film 15 laminated on the second laminate structure, and the p-type semiconductor film 18. The second intermediate film 15 serves as a capping film of the second laminate structure.

The third light emitting part P3 comprises a third laminate structure laminating the n-type semiconductor film 11, the first semiconductor film 12, the first intermediate film 13, the second semiconductor film 14, the second intermediate film 15, and a third semiconductor film 16, a capping film 17 laminated on the third laminate structure, and the p-type semiconductor film 18.

For each of the light emitting parts of the light emitting element 1 (the first light emitting part P1, the second light emitting part P2, or the third light emitting part P3), a p-electrode 19 is formed on the p-type semiconductor film 18. In addition, as shown in FIG. 1, a n-electrode 20 is formed on the single n-type semiconductor film 11 shared by the plurality of light emitting parts. In the meantime, the n-type semiconductor film 11 may be separated by the light emitting parts and the n-electrodes 20 may be formed on the n-type semiconductor film 11 of each of the light emitting parts.

Bandgap of the first intermediate film 13 is higher than bandgaps of the first semiconductor film 12, the second semiconductor film 14, and the third semiconductor film 16. Bandgap of the second intermediate film 15 is higher than the bandgaps of the second semiconductor film 14 and the third semiconductor film 16. In addition, bandgap of the capping film 17 is higher than the bandgap of the third semiconductor film 16.

The first semiconductor film 12, the second semiconductor film 14, and the third semiconductor film 16 may have Multi Quantum Well (MQW) structure. In this case, bandgaps of wells included in the MQW are defined as the bandgaps of the first semiconductor film 12, the second semiconductor film 14, and the third semiconductor film 16.

In general, since the MQW structure has efficiency higher than a single quantum well structure, it is preferable that the first semiconductor film 12, the second semiconductor film 14, and the third semiconductor film 16 have the MQW structure. Meanwhile, since the single quantum well structure has response speed (time from voltage applying to light emitting) higher than the MQW structure, one of the MQW structure or the single quantum well structure can be fit corresponding to purpose.

The bandgap of the second semiconductor film 14 is lower than the bandgap of the first semiconductor film 12. The bandgap of the third semiconductor film 16 is lower than the bandgap of the second semiconductor film 14.

In the first light emitting part P1, the first semiconductor film 12 serves as a light emitting layer and emits light by applying voltage between the n-electrode 20 and the p-electrode 19 to define a p-type semiconductor film 18 side of the first light emitting part P1 as anode and a n-type semiconductor film 11 side of the first light emitting part P1 as cathode.

In the second light emitting part P2, the second semiconductor film 14 serves as a light emitting layer and emits light by applying voltage between the n-electrode 20 and the p-electrode 19 to define a p-type semiconductor film 18 side of the second light emitting part P2 as anode and a n-type semiconductor film 11 side of the second light emitting part P2 as cathode.

In the third light emitting part P3, the third semiconductor film 16 serves as a light emitting layer and emits light by applying voltage between the n-electrode 20 and the p-electrode 19 to define a p-type semiconductor film 18 side of the third light emitting part P3 as anode and a n-type semiconductor film 11 side of the third light emitting part P3 as cathode.

The n-type semiconductor film 11 comprises a n-type semiconductor including donor. The p-type semiconductor film 18 comprises a p-type semiconductor including acceptor.

The first semiconductor film 12, the first intermediate film 13, the second semiconductor film 14, the second intermediate film 15, and the third semiconductor film 16 can comprise an undoped semiconductor (not including intentionally doped dopant). In this case, effect on emission property caused by spread dopant can be controlled.

Although the capping film 17 comprises an undoped semiconductor or n-type semiconductor, it is preferable that the capping film 17 comprises the undoped semiconductor to control spreading donor in the light emitting layers (the first semiconductor film 12 of the first light emitting part P1, the second semiconductor film 14 of the second light emitting part P2, the third semiconductor film 16 of the third light emitting part P3).

The n-type semiconductor film 11, the first semiconductor film 12, the first intermediate film 13, the second semiconductor film 14, the second intermediate film 15, the third semiconductor film 16, the capping film 17, and the p-type semiconductor film 18 typically comprise a nitride semiconductor (a group III-V semiconductor using nitride as a group V element).

For example, the n-type semiconductor film 11, the first intermediate film 13, the second intermediate film 15, the capping film 17, and the p-type semiconductor film 18 comprise a semiconductor represented by the formula $Al_xIn_yGa_zN$ (x+y+z=1, z>0). The first semiconductor film 12, the second semiconductor film 14, and the third semiconductor film 16 have a MQW structure comprising a well comprising $In_vGa_wN$ (v+w=1) layer and a barrier comprising a GaN Layer. Indium composition ratio v of the second semiconductor film 14 is higher than Indium composition ratio v of the first semiconductor film 12. Indium composition ratio v of the third semiconductor film 16 is higher than Indium composition ratio v of the second semiconductor film 14.

Light emitting colors of the first light emitting part P1, the second light emitting part P2, and the third light emitting part P3 are typically blue, green, and red respectively. In the embodiment, color of light having a wavelength of 430 to 480 nm is defined as blue, color of light having a wavelength of 500 to 550 nm is defined as green, and color of light having a wavelength of 600 to 680 nm is defined as red.

For example, the first semiconductor film 12 to emit blue light in the first light emitting part P1 has a MQW structure comprising a well comprising $In_vGa_wN$ (v+w=1, 0.14≤v≤0.33) layer and a barrier comprising a GaN layer. For example, the second semiconductor film 14 to emit green light in the second light emitting part P2 has a MQW structure comprising a well comprising $In_vGa_wN$ (v+w=1, 0.26≤v≤0.33) layer and a barrier comprising a GaN layer. For example, the third semiconductor film 16 to emit red light in the third light emitting part P3 has a MQW structure comprising a well comprising $In_vGa_wN$ (v+w=1, 0.39≤v≤0.48) layer and a barrier comprising a GaN layer.

For example, the thickness of the n-type semiconductor film 11 for each of the light emitting parts are 1 to 5 μm. For example, the thickness of the first semiconductor film 12, the second semiconductor film 14, and the third semiconductor film 16 are 6 to 100 nm. For example, the thickness of the first intermediate film 13 and the second intermediate film 15 are 2 to 100 nm. For example, the thickness of the capping film 17 is 5 to 10 nm. For example, the thickness of the p-type semiconductor film 18 is 10 to 200 nm.

For example, the n-electrode 20 comprises a laminate structure comprising Ti/Al. For example, the p-electrode 19 comprises ITO, IZO, or Ag.

Figure 2:
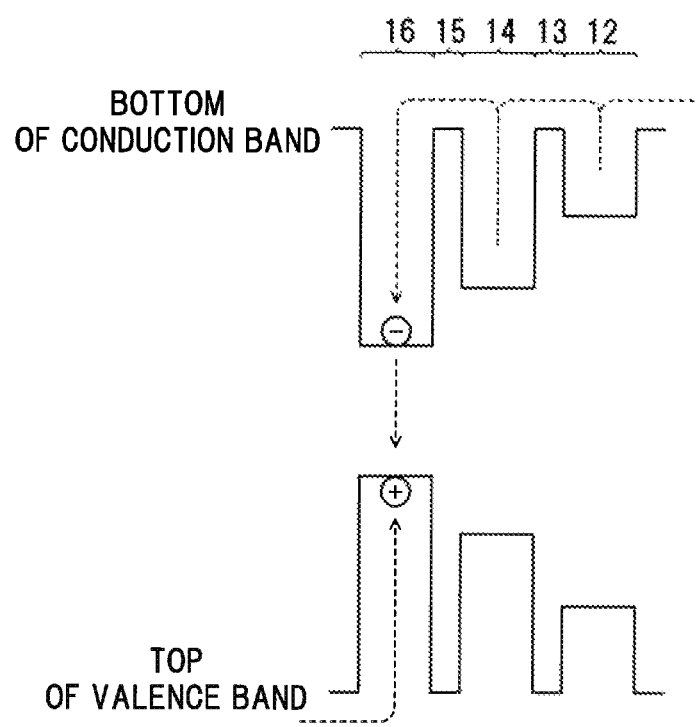
FIG. 2 is a schematic view showing a band structure of third light emitting part.

FIG. 2 is a schematic view showing a band structure of the third light emitting part P3. Estimated emission mechanism of the third light emitting part P3 will be explained by using this schematic view. Although the first semiconductor film 12, the second semiconductor film 14, and the third semiconductor film 16 typically have the MQW structure, FIG. 2 describes as each of the first semiconductor film 12, the second semiconductor film 14, the third semiconductor film 16 have the same bandgaps.

In the third light emitting part P3, an electron is injected into a laminate structure from the n-electrode 20 and a hole is injected into the laminate structure from the p-electrode 19 by applying voltage between the n-electrode 20 and the p-electrode 19 to define the p-type semiconductor film 18 side of the third light emitting part P3 as anode and the n-type semiconductor film 11 side of the third light emitting part P3 as cathode.

The hole injected from the p-electrode 19 and entered into the third semiconductor film 16 mostly stays in the third semiconductor film 16 because barrier height of the second intermediate film 15 viewed from the third semiconductor film 16 is high and thus the hole hardly passes the barrier.

Meanwhile, an electron injected from the n-electrode 20 and entered into the first semiconductor film 12 can comparatively move easily to the third semiconductor film 16 because barrier height of the first intermediate film 13 viewed from the first semiconductor film 12 and barrier height of the second intermediate film 15 viewed from the second semiconductor film 14 are lower than the barrier height of the second intermediate film 15 viewed from the third semiconductor film 16, and electron mobility is higher than hole mobility.

As the reasons described above, an electron and a hole are recombined and emits light in the third semiconductor film 16 that is the nearest semiconductor layer to the p-electrode 19 from the first semiconductor film 12, the second semiconductor film 14, and the third semiconductor film 16.

In addition, in the second light emitting part P2, as with the reasons according to the third light emitting part P3, an electron and a hole are recombined and emit light in the second semiconductor film 14 that is the nearest semiconductor layer to the p-electrode 19 from the first semiconductor film 12 and the second semiconductor film 14.

It is preferable that the bandgap of the second intermediate film 15 is lower than the bandgap of the first intermediate film 13. Hereby, an electron is more effectively injected into the third semiconductor film 16. Meanwhile, even if the bandgap of second intermediate film 15 is lower than the bandgap of the first intermediate film 13, a hole in the third semiconductor film 16 hardly passes the barrier of second intermediate film 15 and moves to the second semiconductor film 14 when the bandgap of the second intermediate film 15 is approximately higher than the bandgap of the first semiconductor film 12.

When the first semiconductor film 12, the second semiconductor film 14, and the third semiconductor film 16 have the MQW structure, the barrier of the first semiconductor film 12 is thinner than the barrier of the second semiconductor film 14 and the barrier of the second semiconductor film 14 is thinner than the barrier of the third semiconductor film 16 so as to keep high crystallinity for each of the light emitting layers and such that the light emitting recombination probability of the first semiconductor film 12 is higher than that of the second semiconductor film 14 and the light emitting recombination probability of the second semiconductor film 14 is higher than that of the third semiconductor film 16.

An example of the method for manufacturing the light emitting element 1 will be described as follows.

FIGS. 3A to 3C, 4A and 4B are vertical cross-sectional views showing the manufacturing process of the light emitting element 1. Herein, a region on the substrate 10 where the first light emitting part P1 is formed, a region on the substrate 10 where the second light emitting parts P2 is formed, and a region on the substrate 10 where the third light emitting parts P3 is formed are respectively defined as a first region R1, a second region R2, and a third region R3.

Figure 3A:
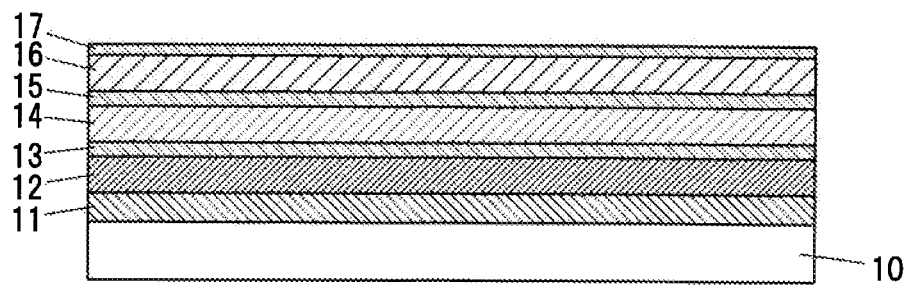
FIG. 3A is a vertical cross-sectional view showing a manufacturing process of the light emitting element according to the embodiment of the invention.

First, as shown in FIG. 3A, the n-type semiconductor film 11, the first semiconductor film 12, the first intermediate film 13, the second semiconductor film 14, the second intermediate film 15, the third semiconductor film 16, and the capping film 17 are laminated on the substrate 10 by metal-organic chemical vapor deposition (MOCVD) and so on.

Figure 3B:
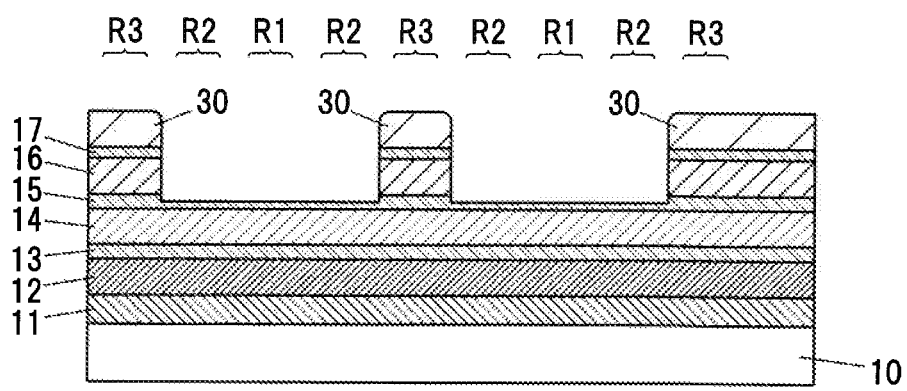
FIG. 3B is a vertical cross-sectional view showing a manufacturing process of the light emitting element according to the embodiment of the invention.

Next, as show in FIG. 3B, the capping film 17, the third semiconductor film 16, and an upper partial region of the second intermediate layer 15 are removed by etching a partial region of the second intermediate film 15 in the first region R1 and the second region R2 while protecting the third region R3 on the substrate 10 by a mask 30.

In this case, the second intermediate film 15 serves as an etch stopper and thus prevents removing the second semiconductor film 14 by over-etching.

Figure 3C:
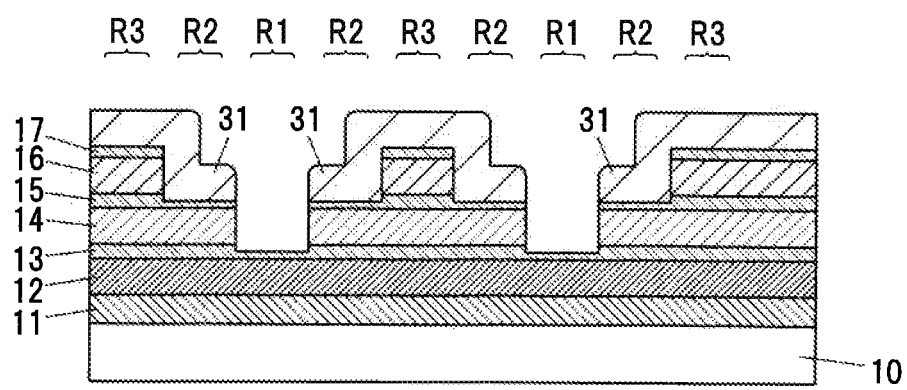
FIG. 3C is a vertical cross-sectional view showing a manufacturing process of the light emitting element according to the embodiment of the invention.

Next, as shown in FIG. 3C, the second intermediate layer 15, the second semiconductor film 14, and an upper partial region of the first intermediate film 13 are removed by etching a partial region of the first intermediate film 13 in the first region R1 while protecting the second region R2 and the third region R3 on the substrate 10 by a mask 31.

In this case, the first intermediate film 13 serves as an etch stopper and thus prevents removing the first semiconductor film 12 by over-etching.

As described above, the first intermediate film 13 and the second intermediate film 15 are respectively used as the etch stopper. It is preferable that the thickness of the first intermediate film 13 is not less than one-third of the thickness of the second semiconductor film 14 and the thickness of the second intermediate film 15 is not less than one-third of the thickness of the third semiconductor film 16 such that the first intermediate film 13 and the second intermediate film 15 certainly serves as the etch stopper.

For example, the masks 30, 31 comprise a resist film formed by a photo lithography process. Etching described above is performed by Reactive Ion Etching (RIE) and so on.

Figure 4A:
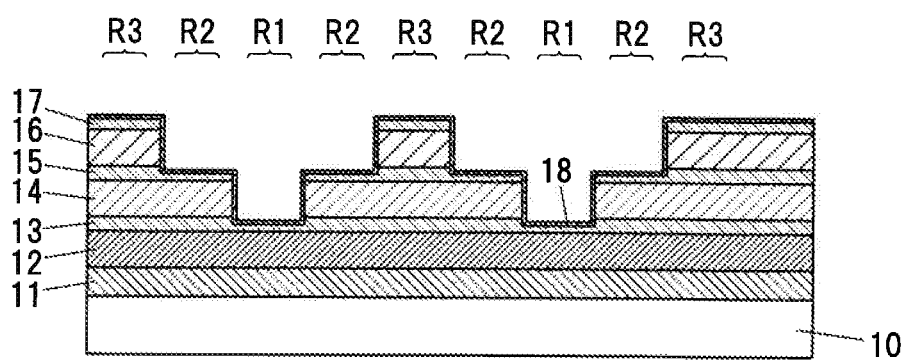
FIG. 4A is a vertical cross-sectional view showing a manufacturing process of the light emitting element according to the embodiment of the invention.

Next, as shown in FIG. 4A, the p-type semiconductor film 18 is formed on the first intermediate film 13 of the first region R1, the second intermediate film 15 of the second region R2, and the capping film 17 of the third region R3.

Figure 4B:
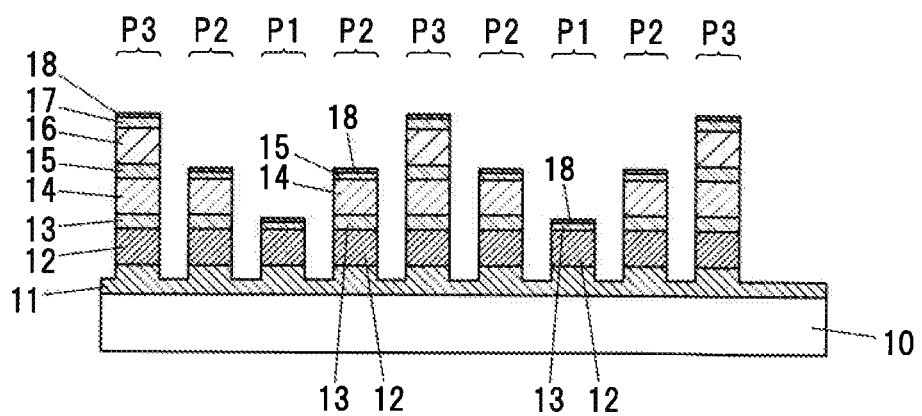
FIG. 4B is a vertical cross-sectional view showing a manufacturing process of the light emitting element according to the embodiment of the invention.

Next, as shown in FIG. 4B, the first light emitting part P1, the second light emitting part P2, and the third light emitting part P3 are formed by separating the p-type semiconductor film 18 continuing between the first region R1, the second region R2, and the third region R3, the second intermediate film 15, the second semiconductor film 14, the first intermediate film 13, and the first semiconductor film 12.

And then, the p-electrode 19 is formed on the p-type semiconductor films 18 of each of the light emitting parts (the first light emitting part P1, the second light emitting part P2, or the third light emitting part P3). In addition, the n-electrode 20 is formed on the n-type semiconductor film 11 and thus the light emitting element 1 shown in FIG. 1 can be obtained. For example, the p-electrode 19 and the n-electrode 20 are formed by photo lithography, filming such as evaporation and sputtering, lift-off processing and so on.

Figure 5A:
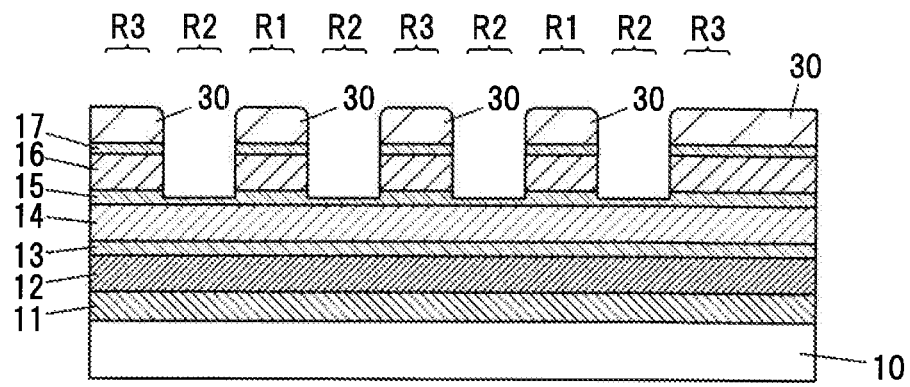
FIG. 5A is a vertical cross-sectional view showing a variation of manufacturing process of the light emitting element.

FIG. 5A shows a state etching only the second region R2 while protecting the first region R1 and the third region R3 by the mask 30 in the first etching process that etches a partial region of the second intermediate film 15.

Figure 5B:
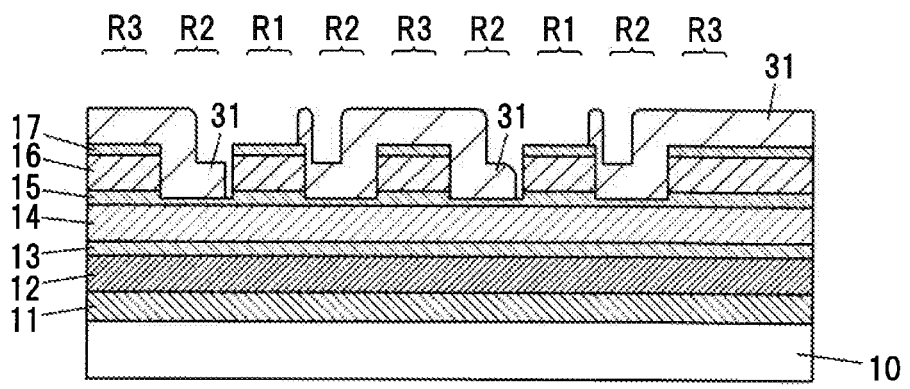
FIG. 5B is a vertical cross-sectional view showing a variation of manufacturing process of the light emitting element.
Figure 5C:
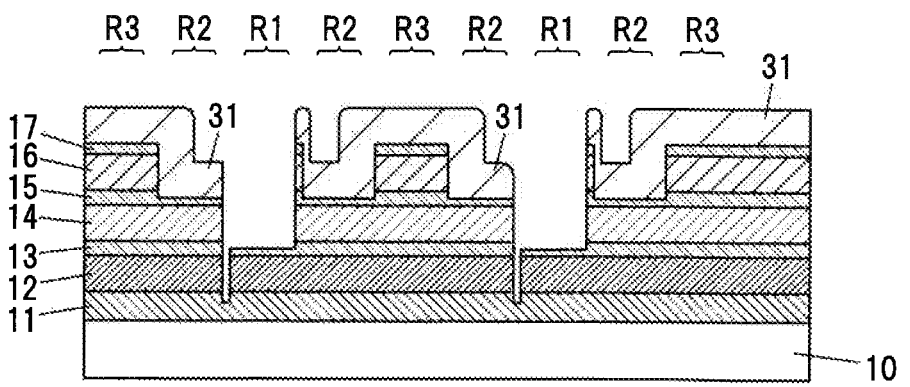
FIG. 5C is a vertical cross-sectional view showing a variation of manufacturing process of the light emitting element.

In this case, as shown in FIG. 5B, if a forming position of the mask 31 used for the second etching process that etches a partial region of the first intermediate film 13 is shifted, as shown in FIG. 5C, it causes a not-etched and left part or an over-etched part.

Thus, as shown in FIG. 3B, it is preferable to etch the partial region of the second intermediate film 15 in the first region R1 and the second region R2 while protecting the third region R3 by the mask 30 in the first etching process.

Figure 6:
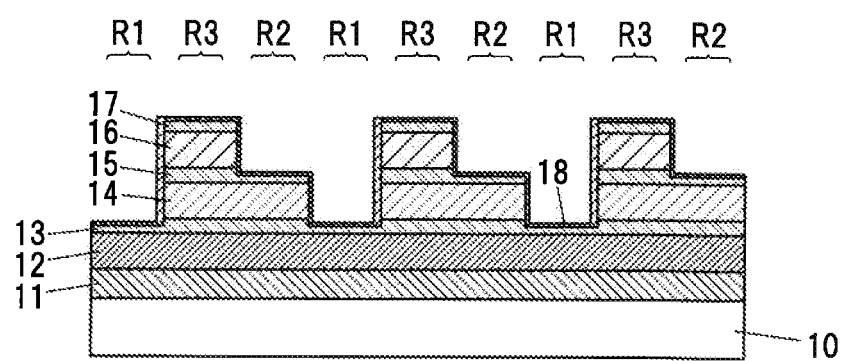
FIG. 6 shows a state after forming the p-type semiconductor film 18 in the manufacturing process of the light emitting element 1 when the first region R1 is adjacent to the third region R3.

FIG. 6 shows a state after forming the p-type semiconductor film 18 in the manufacturing process of the light emitting element 1 when the first region R1 is adjacent to the third region R3. In this case, since a step between the first region R1 and the adjacent third region R3 is large and thus the thickness of p-type semiconductor film 18 may be uneven. In addition, the thickness of resist film in forming the p-electrode 19 and the n-electrode 20 may be similarly uneven and thus shapes of the p-electrode 19 and then-electrode 20 may be varied.

Thus, it is preferable that the first region R1 is not adjacent to the third region R3 so as not to increase the step between the adjacent regions. That is, it is preferable to arrange the first region R1, the second region R2, and the third region R3 such that the first light emitting part P1 is not adjacent to the third light emitting part P3.

Figure 7A:
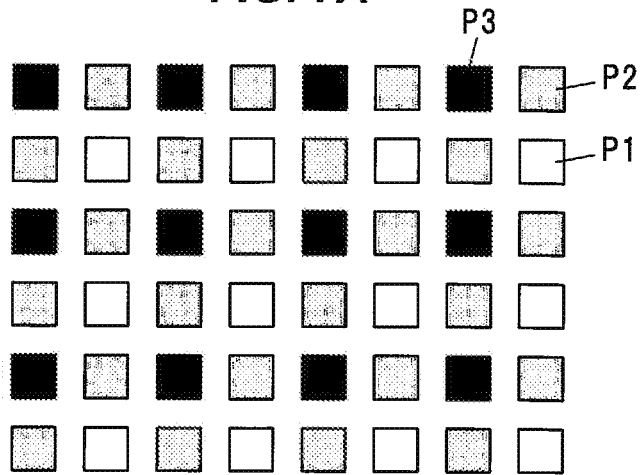
FIG. 7A is a schematic plane view showing an example of arrangement pattern of light emitting parts that the first light emitting part is not adjacent to the third light emitting part.
Figure 7B:
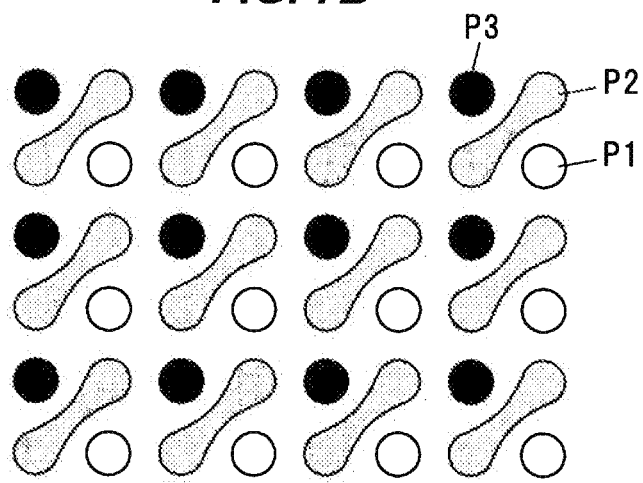
FIG. 7B is a schematic plane view showing an example of arrangement pattern of light emitting parts that the first light emitting part is not adjacent to the third light emitting part.
Figure 7C:
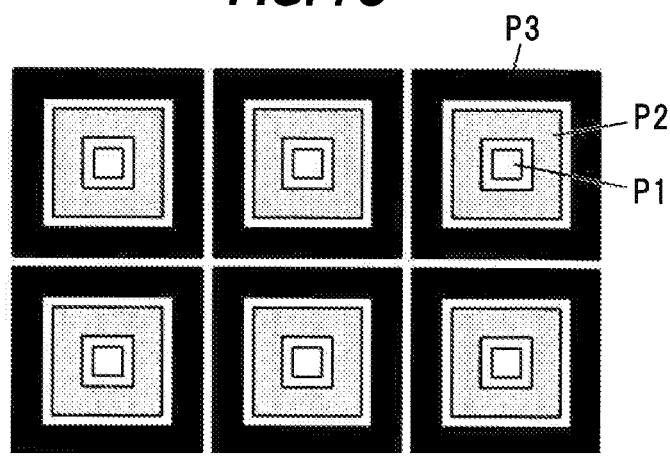
FIG. 7C is a schematic plane view showing an example of arrangement pattern of light emitting parts that the first light emitting part is not adjacent to the third light emitting part.

FIGS. 7A to 7C are schematic plane views showing examples of arrangement patterns of light emitting parts that the first light emitting part P1 is not adjacent to the third light emitting part P3.

As with the patterns shown in FIGS. 7A to 7C, it is preferable to arrange a light emitting part having high light emitting efficiency in a pattern having small total area and a light emitting part having low light emitting efficiency in a pattern having large total area so as to equalize brightness of each color if each of the total areas of the first light emitting part P1, the second light emitting part P2, and the third light emitting part P3 are different.

For example, if the light emitting efficiency in the first light emitting part P1 is higher than that in the second light emitting part P2 and the light emitting efficiency in the second light emitting part P2 is higher than that in the third light emitting part P3, as with the pattern shown in FIG. 7C, the total area in the third light emitting part P3 is larger than that in the second light emitting part P2 and the total area in the second light emitting part is higher than that in the first light emitting part P1.

In the meantime, although a number of the types of the light emitting parts of the light emitting element 1 according to the embodiment is three (the first light emitting part P1, the second light emitting part P2, and the third light emitting part P3), a number of the types of the light emitting parts of the light emitting element of the invention is not limited thereto. The number may be not less than two. In such case, the light emitting element can be manufactured by the same method with the light emitting element 1 described above and thus each of the light emitting parts can emit light as with the same mechanism.

Figure 8:
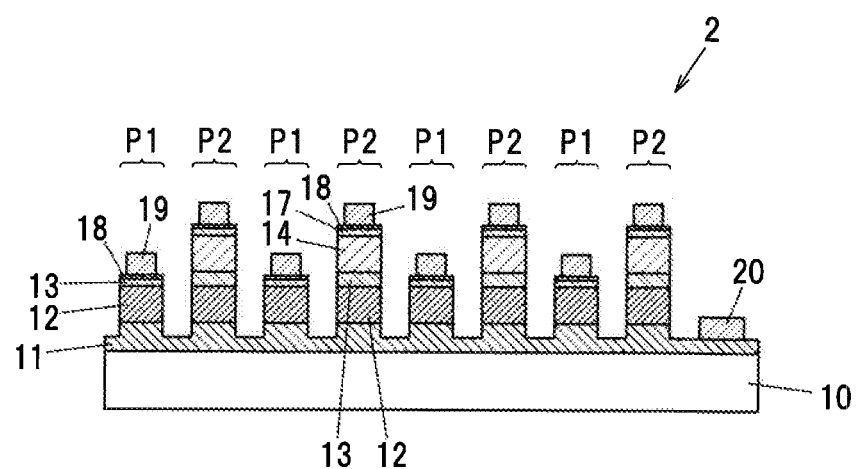
FIG. 8 is a vertical cross-sectional view showing a light emitting element according to the variation of the invention.

FIG. 8 is a vertical cross-sectional view showing the light emitting element 2 according to the variation of the light emitting element 1. The light emitting element 2 comprises the substrate 10 and the first light emitting part P1 and the second light emitting part P2 respectively emitting different colored lights, which are provided on the substrate 10.

The first light emitting part P1 comprises a first laminate structure laminating the n-type semiconductor film 11 and the first semiconductor film 12, the first intermediate film 13 laminated on the first laminate structure, and the p-type semiconductor film 18. The first intermediate film 13 serves as the capping film of the first laminate structure.

The second light emitting part P2 comprises a second laminate structure laminating the n-type semiconductor film 11, the first semiconductor film 12, the first intermediate film 13, and the second semiconductor film 14, the capping film 17 laminated on the second laminate structure, and the p-type semiconductor film 18.

For each of the light emitting parts of the light emitting element 1 (the first light emitting part P1 or the second light emitting part P2), the p-electrode 19 is formed on the p-type semiconductor film 18. In addition, as shown in FIG. 8, the n-electrode 20 is formed on a single n-type semiconductor film 11 shared by the plurality of light emitting parts. In the meantime, the n-type semiconductor film 11 may be separated by the light emitting parts and the n-type electrode 20 may be respectively formed on the n-type semiconductor film 11 of each of the light emitting parts.

The bandgap of the first intermediate film 13 is higher than the bandgaps of the first semiconductor film 12 and the second semiconductor film 14. In addition, the bandgap of the capping film 17 is higher than the bandgap of the second semiconductor film 14. In the meantime, when the first semiconductor film 12 and the second semiconductor film 14 have the MQW structure, bandgap of the well is defined as the bandgaps of the first semiconductor film 12 and the second semiconductor film 14.

The bandgap of the second semiconductor film 14 is lower than the bandgap of the first semiconductor film 12.

In the first light emitting part P1, the first semiconductor film 12 serves as a light emitting layer and emits light by applying voltage between the n-electrode 20 and the p-electrode 19 to define a p-type semiconductor film 18 side of the first light emitting part P1 as anode and a n-type semiconductor layer 11 side of the first light emitting part P1 as cathode.

In the second light emitting part P2, the second semiconductor film 14 serves as a light emitting layer and emits light by applying voltage between the n-electrode 20 and the p-electrode 19 to define a p-type semiconductor film 18 side of the second light emitting part P2 as anode and a n-type semiconductor layer 11 side of the second light emitting part P2 as cathode.

An example of method for manufacturing the light emitting element 2 will be described as follows.

FIGS. 9A to 9D are vertical cross-sectional views showing a manufacturing process of the light emitting element 2. Herein, a region on the substrate 10 where the first light emitting part P1 is formed and a region on the substrate 10 where the second light emitting part P2 is formed are respectively defined as the first region R1 and the second region R2.

Figure 9A:
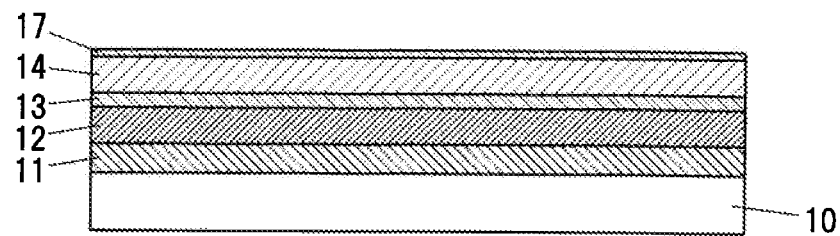
FIG. 9A is a vertical cross-sectional view showing a manufacturing process of a light emitting element according to the variation.

First, as shown in FIG. 9A, the n-type semiconductor film 11, the first semiconductor film 12, the first intermediate film 13, the second semiconductor film 14, and the capping film 17 are laminated on the substrate 10 by MOCVD and so on.

Figure 9B:
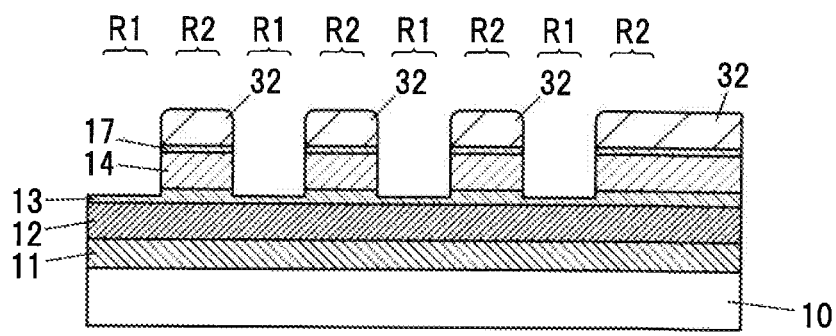
FIG. 9B is a vertical cross-sectional view showing a manufacturing process of the light emitting element according to the variation.

Next, as shown in FIG. 9B, the capping film 17, the second semiconductor film 14, and an upper partial region of the first intermediate layer 13 are removed by etching a partial region of the first intermediate film 13 in the first region R1 while protecting the second region R2 by a mask 32.

In this case, the first intermediate film 13 servers as an etch stopper and prevent removing the first semiconductor film 12 by over-etching.

As described above, the first intermediate film 13 is used as the etch stopper. It is preferable that the thickness of the first intermediate film 13 is not less than one-third of the thickness of the second semiconductor film 14 so as to certainly serve as the etch stopper.

Figure 9C:
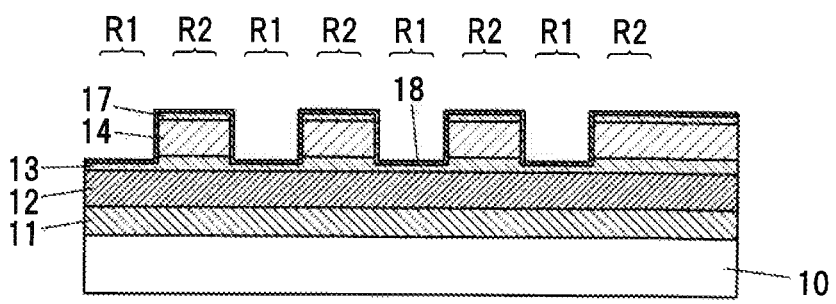
FIG. 9C is a vertical cross-sectional view showing a manufacturing process of the light emitting element according to the variation.

Next, as shown in FIG. 9C, the p-type semiconductor film 18 is formed on the first intermediate film 13 in the first region R1 and the capping film 17 in the second region R2.

Figure 9D:
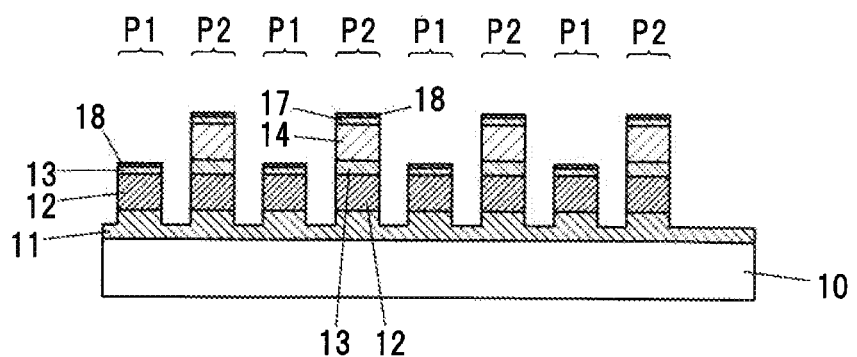
FIG. 9D is a vertical cross-sectional view showing a manufacturing process of the light emitting element according to the variation.

Next, as shown in FIG. 9D, the p-type semiconductor 18, the first intermediate film 13, and the first semiconductor film 12, which continue between the first region R1 and the second region R2 are separated and thus the first light emitting part P1 and the second light emitting part P2 are formed.

Then, the p-electrode 19 is formed on the p-type semiconductor film 18 for each of the light emitting parts (the first light emitting part P1 or the second light emitting part P2) and the n-electrode 20 is formed on the n-type semiconductor film 11. Thus, the light emitting element 2 shown in FIG. 8 can be obtained.

Effects of the Embodiment

According to the above embodiment, it is possible to provide a light emitting element comprising a plurality of light emitting parts emitting different colored lights on the same substrate, which controls degradation caused by varying light emitting characteristic or spreading dopant, and the method for manufacturing the same.

Although the embodiments of the invention have been described, the invention is not intended to be limited to the embodiments and the various kinds of modifications can be implemented without departing from the gist of the invention.

In addition, the invention according to claims is not to be limited to the embodiments. Furthermore, please note that all combinations of the features described in the embodiments are not necessary to solve the problem of the invention.

INDUSTRIAL APPLICABILITY

A light emitting element having a plurality of light emitting parts emitting different colored lights on the same substrate, which controls degradation caused by varying light emitting characteristic or spreading dopant, and the method for manufacturing the same is provided.

REFERENCE SIGNS LIST 1, 2 LIGHT EMITTING ELEMENT
10 SUBSTRATE
11 N-TYPE SEMICONDUCTOR FILM
12 FIRST SEMICONDUCTOR FILM
13 FIRST INTERMEDIATE FILM
14 SECOND SEMICONDUCTOR FILM
15 SECOND INTERMEDIATE FILM
16 THIRD SEMICONDUCTOR FILM
17 CAPPING FILM
18 P-TYPE SEMICONDUCTOR FILM
19 P-ELECTRODE
20 N-ELECTRODE
P1 FIRST LIGHT EMITTING PART
P2 SECOND LIGHT EMITTING PART
P3 THIRD LIGHT EMITTING PART
R1 FIRST REGION
R2 SECOND REGION
R3 THIRD REGION

The invention claimed is:
1. A light emitting element, comprising:
a substrate; and
a first light emitting part and a second light emitting part that are arranged on the substrate and emits different colored lights,
wherein the first light emitting part comprises a first laminate structure in which a n-type semiconductor film and a first semiconductor film are laminated, a first capping film and a p-type semiconductor film laminated on the first laminate structure, wherein the second light emitting part comprises a second laminate structure in which the n-type semiconductor film, the first semiconductor film, a first intermediate film, and a second semiconductor film are laminated, a second capping film and the p-type semiconductor film laminated on the second laminate structure, wherein the first capping film is the first intermediate film, wherein a bandgap of the first intermediate film is higher than bandgaps of the first semiconductor film and the second semiconductor film, wherein the bandgap of the second semiconductor film is lower than the bandgap of the first semiconductor film, wherein the first semiconductor film serves as a light emitting layer by applying voltage to define a p-type semiconductor film side of the first light emitting part as anode and a n-type semiconductor layer side of the first light emitting part as cathode, and wherein the second semiconductor film serves as a light emitting layer by applying voltage to define a p-type semiconductor film side of the second light emitting part as anode and a n-type semiconductor layer side of the second light emitting part as cathode.

2. The light emitting element according to claim 1, wherein a thickness of the first intermediate film is not less than one-third of a thickness of the second semiconductor film.

3. The light emitting element according to claim 1, comprising a third light emitting part that is arranged on the substrate and emits colored light different from the first light emitting part and the second light emitting part, wherein the third light emitting part comprises a third laminate structure in which the n-type semiconductor film, the first semiconductor film, the first intermediate film, the second semiconductor film, a second intermediate film, and a third semiconductor film are laminated, a third capping film and the p-type semiconductor film laminated on the third laminate structure, wherein the second capping film is the second intermediate film, wherein the bandgap of the first intermediate film is higher than bandgaps of the first semiconductor film, the second semiconductor film, and the third semiconductor film, wherein the bandgap of the second intermediate film is higher than the bandgaps of the second semiconductor film and the third semiconductor film, wherein the bandgap of the third semiconductor film is lower than the bandgap of the second semiconductor film, and wherein the third semiconductor film serves as a light emitting layer by applying voltage to define a p-type semiconductor film side of the third light emitting part as anode and a n-type semiconductor layer side of the third light emitting part as cathode.

4. The light emitting element according to claim 3, wherein light emitting colors of the first light emitting part, the second light emitting part, and the third light emitting part are respectively blue, green, and red.

5. The light emitting element according to claim 3, wherein a thickness of the first intermediate film is not less than one-third of a thickness of the second semiconductor film, and wherein the thickness of the second intermediate film is not less than one-third of a thickness of the third semiconductor film.

6. The light emitting element according to claim 3, wherein the bandgap of the second intermediate film is lower than the bandgap of the first intermediate film.

7. The light emitting element according to claim 3, wherein the first semiconductor film, the second semiconductor film, and the third semiconductor film have a multi quantum well structure, wherein a barrier of the first semiconductor film is thinner than a barrier of the second semiconductor film, wherein the barrier of the second semiconductor film is thinner than a barrier of the third semiconductor film.

8. The light emitting element according to claim 3, wherein the first light emitting part, the second light emitting part, and the third light emitting part are arranged such that the first light emitting part is not adjacent to the third light emitting part.

9. A light emitting element emitting different colored lights from a plurality of light emitting parts arranged in lines on a sharing substrate, wherein the plurality of light emitting parts respectively comprises a plurality of light emitting layers emitting the different colored lights in a position according to a predetermined laminating order, wherein the plurality of light emitting layers has a structure that chooses one light emitting layer corresponding to an emitted light having color respectively assigned by the plurality of light emitting parts and applies driving voltage.

* * * * *